(12) United States Patent
Ukhanov

(10) Patent No.: US 10,811,235 B2
(45) Date of Patent: Oct. 20, 2020

(54) METHOD TO FILTER MACRO PARTICLES IN A CATHODIC ARC PHYSICAL VAPOR DEPOSITION (PVD), IN VACUUM

(71) Applicant: Argor Aljba SA, Mendrisio (CH)

(72) Inventor: Sergey Ukhanov, Coldrerio (CH)

(73) Assignee: ARGOR ALJBA SA, Mendrisio (CH)

( * ) Notice: Subject to any disclaimer, the term of this patent is extended or adjusted under 35 U.S.C. 154(b) by 517 days.

(21) Appl. No.: 15/309,050

(22) PCT Filed: May 13, 2014

(86) PCT No.: PCT/IB2014/061393
§ 371 (c)(1),
(2) Date: Nov. 4, 2016

(87) PCT Pub. No.: WO2015/173607
PCT Pub. Date: Nov. 19, 2015

(65) Prior Publication Data
US 2017/0076918 A1    Mar. 16, 2017

(51) Int. Cl.
*H01J 37/32*    (2006.01)
*C23C 14/32*    (2006.01)
(Continued)

(52) U.S. Cl.
CPC ...... *H01J 37/32871* (2013.01); *C23C 14/325* (2013.01); *C23C 14/54* (2013.01);
(Continued)

(58) Field of Classification Search
CPC .................................................... C23C 14/325
See application file for complete search history.

(56) References Cited

U.S. PATENT DOCUMENTS 7,943,017 B2 *  5/2011  Ramm ................. C23C 14/024
                                              204/192.38
8,038,858 B1 * 10/2011  Bures ................... C23C 14/046
                                              204/298.14
(Continued)

FOREIGN PATENT DOCUMENTS

CN         2471791 Y     1/2002
CN       102628159 A     8/2012
(Continued)

OTHER PUBLICATIONS

International Search Report and Written Opinion received in PCT/IB2014/061393 dated Jul. 23, 2016.
(Continued)

*Primary Examiner* — John J Brayton
(74) *Attorney, Agent, or Firm* — Dorsey & Whitney LLP

(57) ABSTRACT

A method to filter macro particles in a cathodic arc physical vapor deposition (PVD) in vacuum is described, said method comprising the step of evaporating a material from a solid source by means of application of the arc on the source, forming a plasma comprising electrons, micro particles (vapor) and ions of evaporated material, together with macro particles larger in size than the micro particles and ions. The arc is moved on the source at a speed (superficial speed) at which the electrons, the micro particles and the ions of material evaporated at a second point deviate, from a path towards a substrate to be coated facing the source, the macro particles formed at a first point previously passed over by the arc, so as to self-clean the plasma of the macro particles and allow condensation of only the cleaned plasma on the substrate.

12 Claims, 2 Drawing Sheets

(51) Int. Cl.
*C23C 14/54* (2006.01)
*H01J 37/34* (2006.01)

(52) U.S. Cl.
CPC .. *H01J 37/32055* (2013.01); *H01J 37/32064* (2013.01); *H01J 37/32541* (2013.01); *H01J 37/34* (2013.01)

(56) References Cited

U.S. PATENT DOCUMENTS

2003/0094366 A1    5/2003   Inaba et al.
2008/0286496 A1*  11/2008   Ramm ................ C23C 14/0021
                                                              427/580

FOREIGN PATENT DOCUMENTS

| DE | 4103981 A1 | 8/1992 | |
|----|------------|--------|---|
| JP | H1025564 A | 1/1998 | |
| KR | 100701267 B1 | 3/2007 | |
| RU | 2153782 C1 * | 7/2000 | ......... C23C 14/0605 |
| WO | WO-9841666 A1 * | 9/1998 | ......... C23C 14/0605 |

OTHER PUBLICATIONS

Davis, W.D. et al., "Analysis of the electrode products emitted by dc arcs in a vacuum ambient", Journal of Applied Physics USA, vol. 40, No. 5, Apr. 1969, pp. 2212-2221.
Takikawa, Hirofumi et al., "Review of Cathodic Arc Deposition for Preparing Droplet-free thin films", IEEE Transactions on Plasma Science, IEEE service center, Piscatawa, NJ, US, vol. 35, No. 4, Aug. 1, 2007, pp. 992-999.
Vyskocil, J. et al., "Cathodic Arc Evaporation in Thin Film Technology", Journal of Vacuum Science and Technology: Part A, AVS / AIP, Melville, NY, vol. 10, No. 4, pt 11: Jul. 1, 1992, pp. 1740-1748.
Siemroth, P. et al., "High-current arc-a new source for high-rate deposition", Surface and Coatings Technology, 68/69, 1994, pp. 314-319.
Witke, T. et al., "Comparison of filtered high-current pulsed arc deposition (cp-HCA) with conventional vacuum arc methods", Surface and Coatings Technology 126, 2000, pp. 81-88.

* cited by examiner

METHOD TO FILTER MACRO PARTICLES IN A CATHODIC ARC PHYSICAL VAPOR DEPOSITION (PVD), IN VACUUM

FIELD OF APPLICATION

The present invention relates to a method to filter macro particles in a cathodic arc physical vapor deposition (PVD), in vacuum.

In particular, the invention relates to a method of the aforementioned type, comprising the step of evaporating a material from a solid source ("cathode") by means of application of the arc on the source, forming a plasma comprising electrons, neutral micro particles (vapor) and ions of evaporated material, together with macro particles larger in size than the micro particles and the ions, and in which the plasma is cleaned of the macro particles so as to prevent the deposition of the macro particles on a substrate to be coated.

The invention also relates to a system for implementing the abovementioned method.

Prior Art

Methods and systems for filtering macro particles during a cathodic arc physical vapor deposition (PVD), in a vacuum, are known.

In a deposition of the type mentioned above, the material of a solid source ("cathode") is evaporated inside a vacuum chamber by means of application of the arc onto the source, forming a plasma which comprises electrons, neutral micro particles (vapor) and ions of evaporated material, together with macro particles of said material. Application of the arc consists in discharging a current on the source and moving the arc on it, so as to evaporate different surface portions thereof.

The size of the macro particles which are generated is larger than that of the neutral micro particles and the ions and, if the macro particles reach the substrate, condensing with the rest of the plasma thereon, they produce defects in the coating.

In particular, the macro particles in the plasma flow are all the more undesirable, the thinner the coating required. In some cases, the thickness of the coating to be formed is comparable with the size of the macro particles and the presence of a few macro particles in the plasma flow is sufficient to adversely affect the quality of the coating.

In order to understand better the difficulties of forming a defect-free coating, it is sufficient to consider that the main products of erosion of the source are the ions and the macro particles; the neutral micro particles (vapor) form only 1% of the plasma. The percentage of macro particles is particularly high when the source is a low melting metal, with a low thermal conductivity coefficient and low electrical conductivity (Zn, Cd, Sn, Pb, Bi) and in the case of graphite; in this case the mass evaporated by the source is formed up to 90% by the macro particles, which have a variable size, for example between 0.1 and 100 microns.

The speed of movement of the macro particles which must be filtered is about $10^2$-$2*10^4$ centimeters per second (cm/s); the macro particles which move with a lower speed do not manage to reach the substrate situated opposite the source. Moreover, the number of macro particles which originate from the cathode depend on different factors, including the cathode material, the arc current and the thermal conditions.

In order to reduce or prevent the deposition of the macro particle on the substrate it is therefore necessary to clean the plasma of the macro particles, taking into consideration the abovementioned factors, namely the speed of the macro particles, their percentage, the cathode material, the arc current, the thermal conditions, etc.

Filtering systems in which a filter is applied between the source and the substrate are known. Particularly effective for reduction of the macro particles are magnetic filters. These filters comprise a non-linear plasma channel to which a magnetic system provided with a coil is applied. Essentially, the coil is wound around the non-linear plasma channel and generates an electromagnetic field which guides the plasma along the axis of the curved channel; the macro particles do not follow the axial path of the channel and are collected in a predetermined zone of the filter. In other words, the macro particles may be filtered because they move in a straight line, differently from the plasma.

However, the magnetic filters have a number of drawbacks, mainly associated with the notable reduction in flow of the plasma across the filter which results in a significant reduction in the speed of deposition of the coating onto the substrate, and therefore a lower efficiency of the plant (system). For example, the speed of deposition is reduced by more than 75% compared to a toroidal filter and more than 90% compared to a sigmoid filter.

When using magnetic filters, it is therefore necessary to compensate for the loss of productivity (efficiency), in particular by means of an increase in the power of the plant. Moreover, in order to ensure a high quality of coating in the power-enhanced plant, it is necessary to provide a more sophisticated filter, with an increase in its complexity and inevitably its cost.

Even with the aforementioned improvements, other drawbacks occur, including the need for constant maintenance of the filter which consists in cleaning the non-linear plasma channel of the macro particles.

The technical problem forming the basis of the present invention is that of devising a method and an associated system for filtering the macro particles during physical vapor deposition in a vacuum, which can be used therefore with a pulsed arc, pulsed laser, HIPIMS, etc., independently or in combination with other filtering systems, and able to prevent the deposition of the macro particles on the substrate to be coated, with a minimum reduction in the speed of deposition of the ions and the micro particles of evaporated material, and reducing the complexity, the costs and the maintenance required by the already known filters, while increasing the efficiency of the system, thereby substantially overcoming all the limitations which hitherto affect the filtering methods and systems of the prior art.

SUMMARY OF THE INVENTION

The idea forming the basis of the present invention is that of moving a cathodic arc on a source in such a way that the plasma generated by the arc at a point of the source may deviate the macro particles present in the plasma generated at another point of the source, preventing the deviated particles from continuing towards a substrate to be coated which is situated in a vacuum and opposite the source towards which substantially only the micro particles, the ions and the electrons proceed, for condensation on the substrate.

In particular, according to the idea mentioned above, the cathodic arc on the source generates a spot, the speed of propagation of which on the surface of the source is controlled so as to push the macro particles outside of the plasma and allow only the plasma cleaned of the macro particles to proceed in a substantially straight direction towards the substrate to be coated.

The aforementioned filtering method is self-cleaning since it uses the generation of the plasma itself at one point to clean the plasma generated at another point of the macro particles contained inside it. In this self-cleaning method, the natural repulsive forces of the micro particles, the ions and the electrons in the plasma are used to deviate the macro particles from a straight direction between the source and the substrate, along which the micro particles, the ions and the electrons may instead proceed.

In accordance with the abovementioned idea the technical problem at the bass of the present invention is solved by a method for filtering micro particles in a cathodic arc physical vapor deposition (PVD) in vacuum (Claim 1), comprising the step of evaporating a material from a solid source (cathode) by means of application of the arc on the source, forming a plasma comprising electrons, neutral micro particles (vapor) and ions of evaporated material, together with macro particles larger in size than the micro particles and ions, and characterized in that the arc is moved on the source at a speed $V_{cs}$ at which the electrons, the micro particles and the ions of material generated by means of evaporation at one point $P_2$ deviate, from a path towards a substrate to be coated situated opposite the source, the macro particles generated at a point $P_1$ previously passed over by the arc, performing self-cleaning of the plasma with respect to the macro particles and allowing condensation of the filtered plasma on the substrate.

The aforementioned self-cleaning action is possible owing to the greater speed of the neutral micro particles, the electrons and the ions of the plasma compared to that of the macro particles: By way of a guide, the speed of the ions is about 100 times greater than the speed of the macro particles, and the speed of the electrons is about 1000 times greater than the speed of the macro particles.

In other words, according to the present invention, the cathode spot generated by the arc on the source is moved at the speed $V_{cs}$ and at said speed it propels, by means of the ions, electrons and neutral particles generated at a point P2, the macro particles generated at a preceding point P1 passed over by the cathode spot; in fact, the macro particles generated at the point P1 have a lower speed than the ions, electrons and neutral particles generated at the following point P2 and are rapidly reached by the ions, electrons and neutral particles generated at P2, and deviated by them from the straight path towards the substrate, such that they are unable to reach the substrate.

According to the present invention, the arc ends at a point on the surface of the source which is not situated facing the substrate and where the macro particles generated are located outside of the straight path along which the plasma may proceed towards the substrate.

Preferably, a mechanical shield is applied to the point of the source where the arc ends, in order to block the macro particles generated at said point, preventing the passage thereof towards the substrate. In this way, even if the plasma at the arc end point may not be cleaned in a self-cleaning manner, since at the end point it is not followed by other plasma with a self-cleaning action, at this point it generates macro particles which cannot reach the substrate, said particles being blocked by the mechanical shield.

The Applicant has found that, by moving the arc on the source with a speed $V_{cs}$ greater than or equal to the ratio of the distance $R_{act}$ between an injection point $P_i$ of the arc and an end point $P_f$ of the arc on the source and the duration t of the arc ($V_{cs} >= R_{act}/t$), practically all of the macro particles do not reach the substrate.

According to one aspect of the invention, the speed $V_{cs}$ of movement of the arc on the source is regulated by means of a variation of a current (C) of a pulse (Imp) of the arc.

According to another aspect of the invention, the distance $R_{act}$ of movement of the arc on the source is regulated by means of a variation of a duration of a pulse (Imp) of a current (C) of the arc.

In a preferred embodiment, the arc ends at a point Pf situated on a surface portion of the source where the macro particles generated by the arc are unable to reach the substrate. Preferably, the end point $P_f$ and/or a starting point $P_i$ of the arc do not face the substrate. For example, the end point $P_f$ and/or said starting point $P_i$ are situated on a side surface of the source which is not aligned with and not facing the substrate.

It is also envisaged using a filtering electrode adapted to block mechanically the macro particles deviated from the path towards the substrate and having an opening for allowing the cleaned plasma to pass through towards the substrate to be coated. This opening in the filtering electrode is situated on a straight line between the source and the substrate.

According to another aspect of the present invention, it is envisaged applying a further filter of the electrostatic type. In particular, the Applicant has devised a particularly advantageous electrostatic filter which makes use of the different speed of the macro particles compared to that of the ions, electrons and micro particles. In fact, the macro particles, because they are larger in size than the micro particles and the ions, have a delayed movement compared to the electrons, the micro particles and the ions of the plasma, and acquire a positive charge outside of the plasma.

The Applicant, considering the delay in the movement of the macro particles, has advantageously envisaged applying the arc on the source with pulses of a predetermined duration (T) and applying an electrostatic field (E) between the source and the substrate which moves the macro particles away from the substrate during the intervals (I) of application of said pulses (T) of the pulsed arc.

Preferably, the duration T of the pulsed arc is less than or equal to $$D/V_{mp}+\Delta t,$$

where D is the distance between the source and the facing substrate, $V_{mp}$ is the speed of the macro particles and $\Delta t$ is the time during which the macro particles acquire positive charge.

According to one aspect of the invention, the electrostatic field (E) is generated by an electrode pair with a difference in potential U greater than or equal to $$U>=(mV^2)/2e,$$

where m is the mass of a macro particle, V is its speed towards the substrate and e is its electric charge.

In particular, the substrate is associated with an electrostatic anode of the electrode pair and a vacuum chamber is associated with an electrostatic cathode of this electrode pair.

In one embodiment, the anode of the electrode pair also acts as a filtering electrode, adapted to block mechanically the macro particles deviated from the path towards the substrate, in accordance with that already mentioned above.

The method according to the present invention is therefore based on the different speed of the micro particles and the macro particles emitted at the same time as plasma from the surface of the cathode. The ions have a speed of about $10^6$ cm/sec per second and the macro particles have a speed of about $10^2$-$2\times10^4$ cm/sec.

The method makes use of the distance between the cathode and the substrate, along which the macro particles are separated spatially from the micro particles, the ions and the electrons. In particular, owing to their greater speed, the ions and the micro particles move towards the substrate more rapidly than the macro particles. From among the macro particles, firstly the smaller size and faster macro particles and then the larger size and slower macro particles move towards the substrate.

According to the method, self-cleaning of the macro particles of any size is performed, namely the repulsive forces in the plasma are used to propel the macro particles outside of the path towards the substrate. The electrostatic filter helps perform filtering of the macro particles which have not been sufficiently repelled by the above procedure.

Further characteristic features and advantages of the present invention will become clear from the following description below, provided with reference to the accompanying drawings purely by way of a non-limiting example.

DETAILED DESCRIPTION

Figure 1:
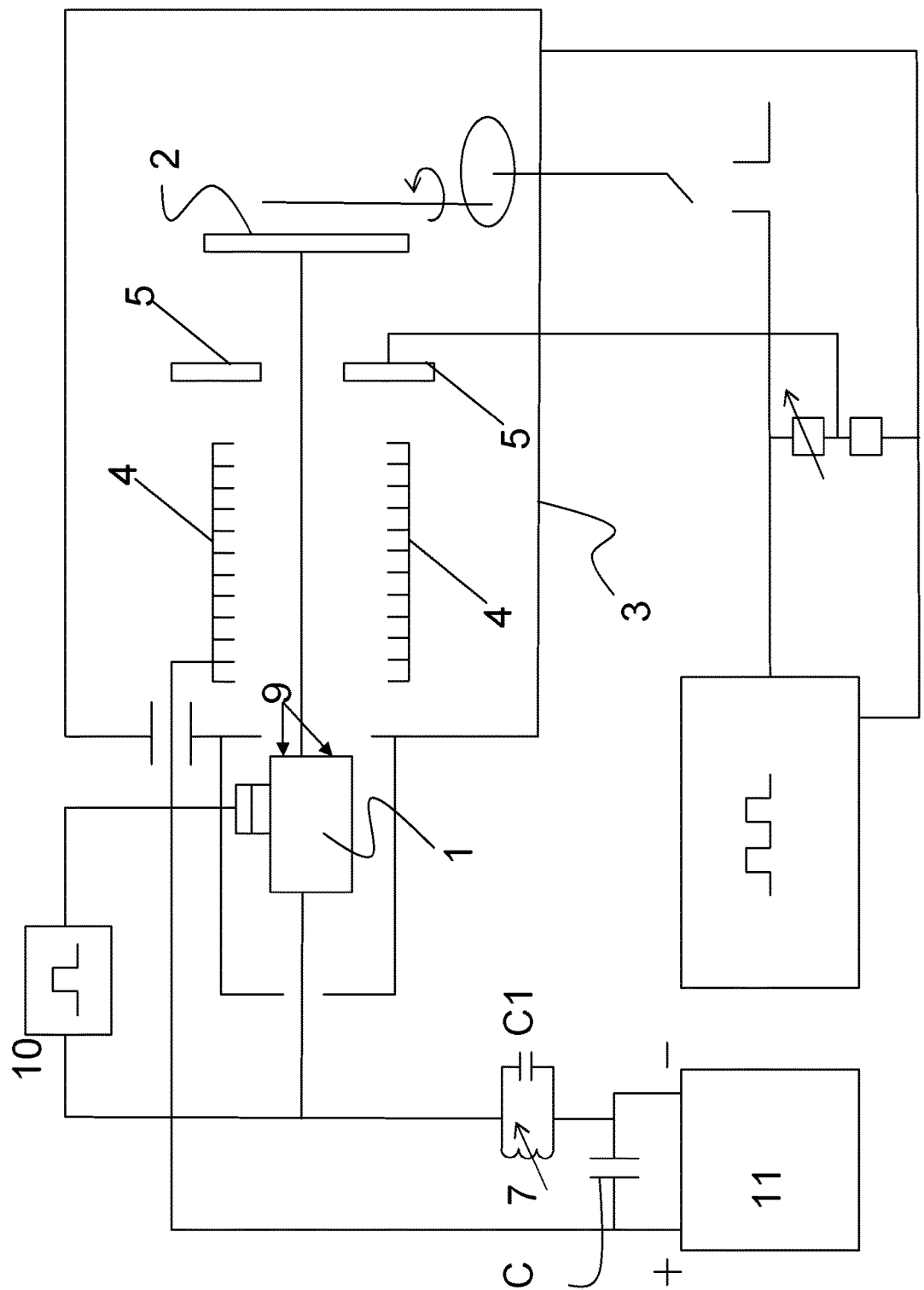
FIG. 1 shows in schematic form a filtering system according to the present invention.

Below there follows, with reference to the accompanying figures, a description of the filtering method according to the present invention, during a process for generating the plasma for coating a substrate.

The plasma is generated by means of application of an arc on a cathode source 1. For example, by means of a pulsed discharge on the source 1, macro particles are emitted in a plasma which also comprises ions, micro particles and electrons. During the main discharge pulse, the macro particles are charged negatively and when they remain outside the plasma, owing to their lower speed compared to the rest of the plasma, they change their electric charge, therefore assuming a positive charge.

As a result of the change in charge, the temperature of the macro particles and the ions increases and a thermionic emission and photoemission of electrons from the ultraviolet radiation take place. In particular, in a space between the source and the substrate an overload of macro particles with a positive charge occurs in the absence of plasma; this takes place because the ions, the electrons and the micro particles of the plasma have already exited the space, moving towards the substrate 2 to be coated, in a time interval shorter than the duration of the pulse. For example the duration of the pulse may be 100 ms, and in the time interval of 100 ms of the pulse the ions, the electrons and the micro particles may have already surpassed the macro particles.

According to another aspect of the present invention, an electric field, which is also called deceleration or deflection field, is applied along the path of the macro particles from the source 1 to the substrate 2, which repels or deviates the electrostatically charged macro particles. In particular, owing to the absence of plasma (ions, micro particles and electrons) and the presence of the low-density charged macro particles in the space between the cathode 1 (source) and the substrate 2, it is possible to perform electrostatic separation in the time intervals I between the pulses (by means of application of the electrostatic field).

In fact, in these conditions, there are no limitations associated with the plasmatic screening of the electric fields. It is therefore possible to use electrodes in order to create a delaying electrostatic field along the path of the positively charged macro particles, for example using a large-mesh (10-50 mm) grille or by means of stand-alone electrodes.

The delaying electrostatic field is created by at least two electrodes which are arranged between the cathode erosion zone (source 1) and a coating surface of the substrate 2. An electrode with the same potential as the macro particles, or electrostatic anode, is associated with the coated surface of the substrate, for example close thereto. The electrostatic anode may consist of the substrate itself, for example the substrate 2 of FIG. 1. A second electrode, or electrostatic cathode, may for example be associated with a vacuum chamber 3.

According to the present invention, by applying an electric potential between the electrodes with value $$U > = (mV^2)/2e,$$

where m is the mass of a macro particle, V is its speed towards the substrate and e its electric charge, it is possible to push the particle of mass m and charge e in the opposite direction to the direction of movement of the plasma (ions, electrons and micro particles) towards the substrate 2.

The macro particles for which the above condition U has occurred are repelled by the electrostatic field, without being able to reach the substrate 2.

The macro particles for which the above condition U has not occurred are able to reach the substrate 2. However, these macro particles may have a significantly smaller kinetic energy and have a poor adhesion to the substrate 2. The above occurs especially with the cathodes 1 made of, material with a high melting resistance, for example consisting of carbon, tungsten or chrome, which generate mainly micro particles in the form of solid fragments and not liquid micro droplets.

Moreover, the macro particles which are deposited on the substrate 2 have the same polarity as the substrate 2 and therefore are such as to be repelled. The cold neutral macro particles which fall from the walls of the vacuum chamber 3 onto the surface to be coated of the substrate 2 are similarly repelled by it.

The efficiency of the electrostatic field filtering method is proportionally less with an increase in the size of the macro particles, despite the fact that these particles have a speed which is less than that of the smaller size macro particles. This loss in efficiency is due to the fact that, in the condition $U > = (mV^2)/2e$, the ratio between the charge e and the mass m of the larger-size macro particles is less than the ratio between the charge e and the mass m of the smaller-size macro particles; in fact, the charge increases in proportion to the surface area or the square of the radius while the mass increases in proportion to the cube of the radius. However, the large macro particles also have a lower speed than the smaller particles.

Advantageously, the invention therefore envisages applying the electrostatic field for filtering specifically macro particles with a size smaller than a predefined threshold and a high speed. In this case, the constant and/or pulsed voltage in the electrostatic anode which has the same polarity as the macro particles is applied when there is no deposition of the plasma (ions, electrons, micro particles) on the substrate.

Figure 2:
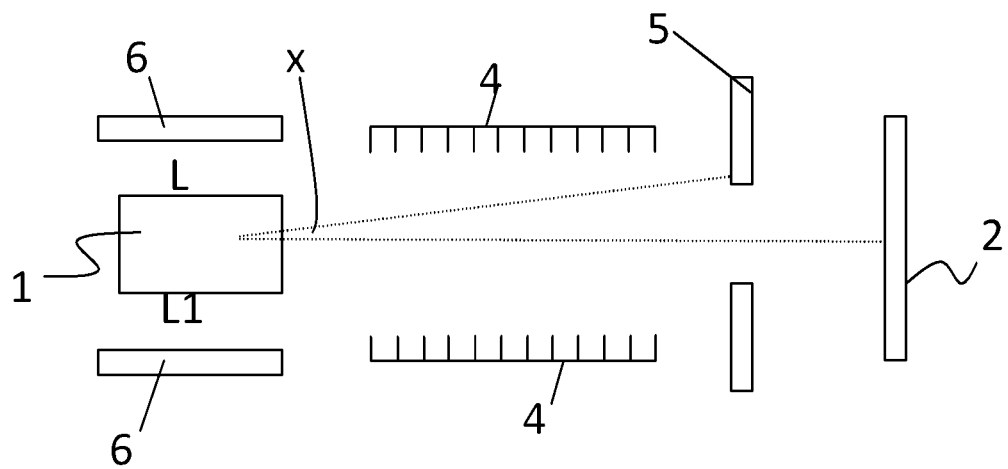
FIGS. 2-4 show in schematic form a detail of the filtering system shown in FIG. 1 according to respective embodiments.
Figure 3:
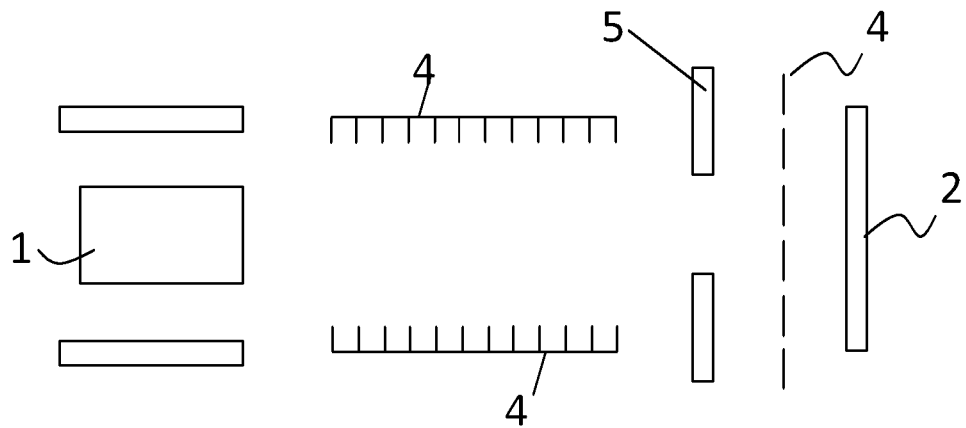
Figure 4:
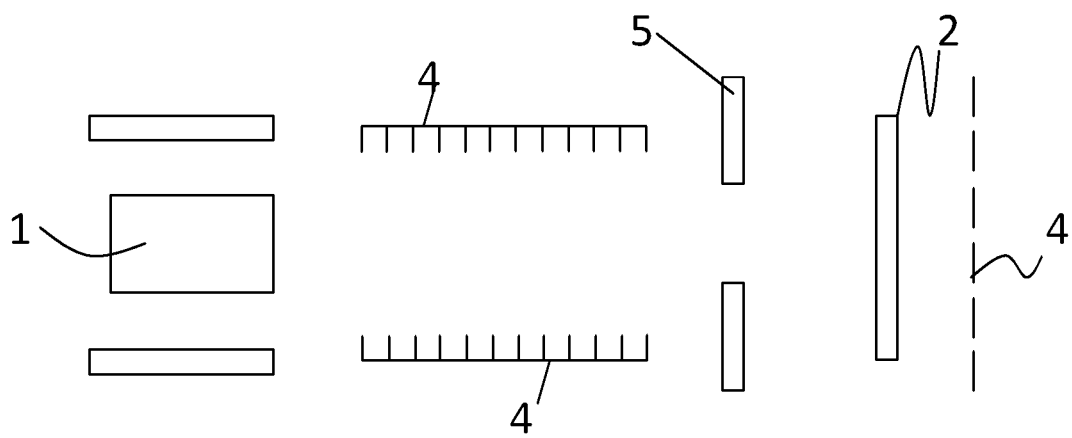

As mentioned, the anode may be the substrate 2 itself. However, the electrostatic anode may consist of a separate component, situated between the substrate 2 and the cathode 1. This separate arrangement of the electrostatic anode is suitable in the case where the surface to be coated is not conductive and therefore the substrate cannot act as an electrostatic anode, or in the case where it is undesirable to apply a potential to the substrate 2. The substrate 2 may also be situated between the electrostatic anode and the cathode 1; this separate arrangement of the electrostatic anode is also suitable for non-conductive coatings or if it is undesirable to apply a potential to the substrate. Different configurations are possible, for example by positioning an anode both in front and behind the substrate 2. FIGS. 2 to 4 show different configurations of the substrate 2 with respect to the anode 4; the cathode being associated with the source 1.

For macro particles which are larger in size than the predefined threshold, with a greater ratio between the charge and the mass of the macro particle and therefore with a lower speed towards the substrate 2, i.e. those macro particles which are insufficiently hot to produce a thermionic emission of electrons, it is envisaged using a filtering electrode 5 with a positive potential. The filtering electrode 5 (FIGS. 2-4) performs mechanical filtering of the particles emitted from the cathode beyond a predefined angle x. In particular, owing to its positive potential, the filtering electrode 5 may also be used as an electrostatic filter 4.

The filtering electrode 5 is particularly effective for blocking the large and cold macro particles in fact, while the hot macro particles have time to change the sign of the charge and therefore may be effectively delayed by the electrostatic filter 4, the large and cold macro particles do not manage to reverse their charge and may proceed dangerously towards the substrate 2; in this case, the filtering electrode 5 forms a shield which protects the substrate 2 from the negatively charged macro particles.

The parameters for discharge between the cathode 1 and the anode 4 are preferably as follows:

The current pulse is greater than 300 A. Advantageously, using a same current pulse, a physical phenomenon which eliminates the need for a magnetic system for focusing the plasma beam occurs.

The speed of movement of the cathode spots on the surface of the source 1 is selected so as to perform self-cleaning of the plasma.

This self-cleaning mode has an effect both on the larger-size and slower macro particles and on the smaller-size and faster macro particles and is used mainly for filtering the plasma according to the present invention.

For example, in the case of a cathode 1 made of carbon with a diameter of 30 mm and an injection zone in the centre of the source, the duration of the pulse is set to between 0.8 and 1.1 milliseconds.

The minimum duration of the pulse is equivalent to the time interval during which the erosion zone is moved on the surface of the cathode 1 until it reaches a point without a visual line directed at the substrate.

The duration T of the pulsed arc is less than or equal to $D/V_{mp}+\Delta t$, where D is the distance between the source 1 and the facing substrate 2, $V_{mp}$ is the speed of the macro particles and $\Delta t$ is the time during which the macro particles acquire positive charge.

The arc may be started at the end and on the side surface L (e.g. FIG. 2) of the cathode 1 and must end on the cathode surface 1, in a zone which is situated outside the visibility of the substrate (e.g. L1 in FIG. 2) The end surface may be the side surface L1 of the cathode or one end of the cathode 1 associated with covering means 6 which block and prevent the propagation of the macro particles. These covering means may be associated with the injection electrode.

If the arc is started at a point on a direct and visible line between the cathode 1 and the substrate 2, a capacitor C1 may be provided (FIG. 1). Said capacitor is used to stabilize the firing conditions of the individual pulses and reduce the initial arc generation current.

The speed of movement of the cathode spots is regulated by means of an inductance 7 on the cathode.

The cathode spots move relative to each other on the cathode 1 at a speed which depends on the discharge current. Initially the cathode spots move rapidly and, then slow down, as they occupy the surface of the cathode 1; the slowing down is proportional to the occupied surface of the cathode 1.

For example, the cathode spots in a carbon cathode 1 appear for a working time of about 100-200 ms and are gradually extinguished. During this time period, a macro particle with a speed of 200 m/s is removed from the plasma at 2-4 cm from the cathode and a macro particle with a speed of 50 m/s is removed at 0.5-1 cm.

According to the present invention, a preferred condition for removal of the large-size macro particles from the plasma occurs when the cathode spots have a predefined speed which the Applicant has determined on the basis of the following considerations and analysis.

The duration of the pulsed discharge in the cathode 1 has been divided up on a basic level into a plurality of intervals each corresponding to the generation of a plasma flow $Pl_i$. In practice, in the first interval "1" a first plasma flow $P_1$ is generated, in the second interval "2" a second plasma flow $P_2$ is generated, and so on, until in the last end interval a plasma flow $P_{end}$ is generated.

The plasma $Pl_2$ which is generated at point 2 and is caused by the movement of the arc on the cathode 1, has the effect of propelling or pushing away the macro particles which have been emitted from the surface of the cathode 1 at the preceding point 1, where the plasma flow $Pl_1$ was generated.

The speed of movement of the arc is particularly important.

In fact, if the speed of the cathode spots is too high, the plasma $Pl_2$ manages to move away too far from the point where the macro particles, emitted with the plasma $Pl_1$, were generated at point 1 and therefore does not manage to propel (sweep) these macro particles outside of the path towards the substrate 2.

Vice versa, if the speed of the cathode spots is too low, the plasma flow $Pl_1$ generated at the point 1 propels the macro particles generated with the plasma $Pl_2$ at the point 2 towards the substrate 2.

The Applicant has determined that the speed $V_{cs}$ of movement of the arc on the source 1 ideal for cleaning the plasma of the macro particles is greater than or equal to the ratio of the distance ($R_{act}$) between the point of injection $P_i$ of the arc and an end point $P_f$ of the arc on the source and the duration t of the arc ($V_{cs} \geq R_{act}/t$).

The arc moved on the source at the speed $V_{cs}$ (superficial speed) performs self-cleaning of the plasma because the electrons, the micro particles and the ions of material evaporated at the point $P_2$ deviate, from the path towards the substrate 2 to be coated facing the source 1, the macro particles formed at the point $P_1$ previously passed over by the arc.

Advantageously, the deposition of the micro particles and the ions on the substrate 2 occurs substantially without macro particles and has a high productivity, owing to the absence of filters which slow down the flow of the cleaned plasma towards the substrate, differently from that envisaged by the prior art.

In the case where different materials are used on the source 1, it is important to regulate the energy of the ions deposited, in particular for DLC coatings. As a result of said regulation it is possible to control the ratio between the steps sp2 and sp3 and therefore obtain coatings in a wide range. The maximum energy of the ions is determined by the voltage between the cathode and the anode and is preferably between 100 and 500 Volt.

The energy of the ions in the plasma beam (flow) is not the same. The beam carries at the front the electrons, followed by the high-energy ions, followed by the low-energy ions in the tail of the beam; the latter may reduce the quality of the coating.

According to one aspect of the present invention, the ions with energy below a predetermined threshold may also be filtered. For this filtering operation, particular current values are set in the electrostatic filter; in particular, the current increases with an increase in the percentage of ions which fall under the influence of the electrostatic filter.

Finally, it is possible, by setting current values in the electrostatic filter which exceed the current of the ions, to block completely the ion component of the plasma and perform cleaning of the substrate by means of the plasma electrons.

The structural and electrical components of a filtering system for implementing the method according to the present invention are described hereinbelow with reference to FIG. 1.

The system comprises a vacuum chamber 3. A source or cathode 1 and an anode 4 are axially arranged with respect to each other; for example the anode 4 is a ribbed anode and is located between the cathode 1 and a substrate to be coated 2; alternatively, an electrostatic potential with positive polarity (pulse or DC) is supplied, for example by means of a power supply block, to the substrate to be coated 2, which also acts as an electrostatic anode. The arc discharge anode 4 does not correspond to the electrostatic anode and is not connected electrically thereto. The electrostatic potential with negative polarity is for example connected to the chamber 3.

An erosion zone 9 of the cathode 1 is situated opposite the substrate 3 to be coated; said substrate 2 may be for example mounted on a rotating or fixed carousel. The system comprises a discharge circuit which includes an adjustable inductance 7.

An injection system 10 ignites an arc on the surface of the cathode 1. A discharge occurs between the anode 4 and the electrostatic cathode 3, in a time interval t during which the plasma moves rapidly towards the substrate 2. In the interval between successive discharges, the electrostatic anode and cathode are used to create the field adapted to delay or deviate the macro particles of plasma.

The plasma ions and the micro particles are deposited on the substrate under normal conditions, namely the electrostatic field does not have any influence on them. The macro particles move more slowly than the ions and in particular first the smaller and faster particles move, followed by the slower and heavier particles.

During the pulsed discharging, the speed of the cathode spots is regulated by means of an accelerator so that erosion of the cathode 1 is performed in a self-cleaning manner, i.e. by pushing the macro particles generated at a point outside the substrate path, across the plasma generated at another point. In particular, the erosion zone terminates a surface of the cathode which is situated outside the visual field of the substrate.

The process is then repeated.

Preferably, a filtering electrode 5 with positive potential for mechanical filtering of the macro particles is provided at the output of the anode 4.

The electrostatic anode 4 is connected to the positive potential at at least 40 volts less than the electrostatic cathode.

The invention claimed is:

1. A method to filter macro particles in a cathodic arc physical vapor deposition ("PVD") in vacuum, the method comprising:
    evaporating a material from a solid source by application of a pulsed arc having pulses of a predetermined duration on the solid source;
    forming a plasma including electrons, micro particles, and ions of evaporated material, together with macro particles larger in size than the micro particles and the ions of evaporated material; wherein the evaporated material includes carbon;
    wherein application of the pulsed arc on the solid source includes:
        moving the pulsed arc on the solid source at a speed at which the electrons, the micro particles, and the ions of evaporated material evaporated at a point, propel from a path towards a substrate to be coated facing the solid source; the macro particles formed at a point previously passed over by the pulsed arc so as to self-clean the plasma of the macro particles and allow condensation of only the cleaned plasma on the substrate;
    wherein the pulsed arc has a pulse with a current greater than 300 A and focuses the plasma in absence of a magnetic system;
    applying an electrostatic field between the solid source and the substrate to move the macro particles away from the substrate during intervals of application of the pulses of the pulsed arc;
    wherein the macro particles, owing to a larger size thereof, have a delayed movement with respect to the electrons, the micro particles and the ions of the plasma, and acquire a positive charge outside of the plasma;
    wherein the electrostatic field is generated by an electrode pair with a difference of potential U greater than or equal to $U >= (mV^2)/2e$, where m is the mass of a macro particle, V is its speed towards the substrate and e is its electric charge, and wherein
        an electrode of the electrode pair with a same potential as the macro particles is associated with the substrate.

2. The method according to claim 1, wherein the speed of the pulsed arc on the solid source is greater than or equal to a ratio of a distance between a point of injection of the pulsed arc and an end point of the pulsed arc on the solid source and a duration of the pulsed arc.

3. The method according to claim 1, wherein the speed of the pulsed arc on the solid source is regulated by a variation of a current of the pulses of the pulsed arc.

4. The method according to claim 1, wherein a distance of movement of the pulsed arc on the solid source is regulated by a variation of a duration of the pulses of current of the pulsed arc.

5. The method according to claim 1, wherein the pulsed arc ends at a point situated on a surface portion of the solid source where the macro particles generated by the pulsed arc cannot reach the substrate.

6. The method according to claim 5, wherein the end point and/or a starting point of the pulsed arc do not face the substrate.

7. The method according to claim 5, wherein the end point and/or the starting point of the pulsed arc are situated on a side surface of the solid source.

8. The method according to claim 7, wherein the duration of the pulsed arc is less than or equal to $D/V_{mp}+\Delta t$, where D is the distance between the solid source and the facing substrate, $V_{mp}$ is a speed of the macro particles, and $\Delta t$ is a time during which the macro particles acquire positive charge.

9. The method according to claim 1, further comprising a filtering electrode adapted to mechanically block the macro particles deviated from the path, the filtering electrode having an opening through which the cleaned plasma passes towards the substrate to be coated.

10. The method according to claim 9, wherein the pair of electrodes includes an anode that is the filtering electrode.

11. The method according to claim 10, wherein the anode is ribbed.

12. The method according to claim 1, further comprising a vacuum chamber associated with an electrostatic cathode of the electrode pair.

* * * * *